United States Patent [19]

Fujiki et al.

[11] Patent Number: 4,866,376
[45] Date of Patent: Sep. 12, 1989

[54] CROSS-OIL INSTRUMENT HAVING TESTING APPARATUS FOR VEHICULAR SENSOR DISCONNECTION INDICATION

[75] Inventors: Norio Fujiki; Masahiro Ishikawa; Masao Kawagishi; Takatoshi Hayashi, all of Kanagawa, Japan

[73] Assignee: Nissan Motor Company, Limited, Japan

[21] Appl. No.: 55,615

[22] Filed: May 29, 1987

[30] Foreign Application Priority Data

May 30, 1986 [JP] Japan .................. 61-123749

[51] Int. Cl.$^4$ .................. G01P 3/00; G01R 31/04
[52] U.S. Cl. .................. 324/160; 324/538; 324/503; 340/652
[58] Field of Search .............. 324/503, 537, 538, 160, 324/166, 154 R, 110, 157; 303/92; 340/686, 687, 652

[56] References Cited

U.S. PATENT DOCUMENTS

| | | | |
|---|---|---|---|
| 3,680,923 | 8/1972 | Peterson et al. | 324/503 X |
| 4,098,542 | 7/1978 | Rajput et al. | 303/92 |
| 4,309,585 | 1/1982 | Doi et al. | 340/687 X |
| 4,425,622 | 1/1984 | Arikawa | 303/92 X |
| 4,553,093 | 11/1985 | Chikasue | 324/166 X |
| 4,638,399 | 1/1987 | Maroney et al. | 340/652 X |

FOREIGN PATENT DOCUMENTS 55-64773  5/1980  Japan .

Primary Examiner—Reinhard J. Eisenzopf
Assistant Examiner—Jack B. Harvey
Attorney, Agent, or Firm—Lowe, Price, LeBlanc, Becker & Shur

[57] ABSTRACT

An apparatus for testing a cross-coil instrument having a pointer, a sensor for sensing a condition to produce a sensor signal indicative of the sensed condition, and a converter coupled to the sensor for converting the sensor signal to a deflection of the pointer. The apparatus comprises a fault detector coupled to the sensor for detecting a disconnection fault to produce a command signal, and a test signal generator responsive to the command signal for generating a predetermined test signal to the converter, thereby moving the pointer to a predetermined position. The operation accuracy of the cross-coil instrument may be checked from the difference between the actual and predetermined pointer positions when a connector provided in a signal line between the sensor and the fault detector is pulled out.

11 Claims, 3 Drawing Sheets

CROSS-OIL INSTRUMENT HAVING TESTING APPARATUS FOR VEHICULAR SENSOR DISCONNECTION INDICATION

BACKGROUND OF THE INVENTION

This invention relates to an apparatus for testing a cross-coil instrument.

Cross-coil instruments have been used, for example, inelectrical speedometers for providing a vehicle velocity indication. Such cross-coil instruments include a pair of cross coils arranged to produce a magnetic field so as to move a pointer secured on a magnet when a voltage signal is applied thereto. The instrument also includes a velocity sensor which senses the existing vehicle velocity and generates a sensor signal having a frequency corresponding to the sensed vehicle velocity. The sensor signal is applied to a frequency-to-voltage converter where it is converted to a corresponding voltage signal which is applied to energize the cross coils.

The frequency-to-voltage converter is also connected through a manual switch to a test signal generator which generates a test signal having a predetermined frequency selected to move the pointer to a predetermined position when the instrument is operating in order. It is, therefore, possible to test the instrument from a view of the difference between the actual and the predetermined positions by operating the manual switch to connect the test signal generator to the frequency-to-voltage converter.

However, it is the current practice to place the manual switch on a circuit board on which the cross-coil gage is positioned. For this reason, an operator cannot operate the manual switch without troublesome operations removing the maintenance panel, the sound arrester plate and the meter cluster. It may be considered to place the manual switch at a position convenient for the operator. However, this is costly requiring additional parts such as harness switches, connectors, and the like.

SUMMARY OF THE INVENTION

Therefore, it is a main object of the invention to provide an improved cross-coil instrument testing apparatus which can operate without troublesome operations required in conventional instruments.

There is provided, in accordance with the invention, an apparatus for testing a cross-coil instrument having a pointer, a sensor for sensing a condition to produce a sensor signal indicative of the sensed condition, and a converter coupled to the sensor for converting the sensor signal to a deflection of the pointer. The apparatus comprises means coupled to the sensor for detecting a disconnection fault to produce a command signal, and a test signal generator responsive to the command signal for generating a predetermined test signal to the converter.

BRIEF DESCRIPTION OF THE DRAWINGS

The invention will be described in greater detail by reference to the following description taken in connection with the accompanying drawings, in which like reference numerals refer to the same or corresponding parts, and wherein.

DETAILED DESCRIPTION OF THE INVENTION

Figure 1:
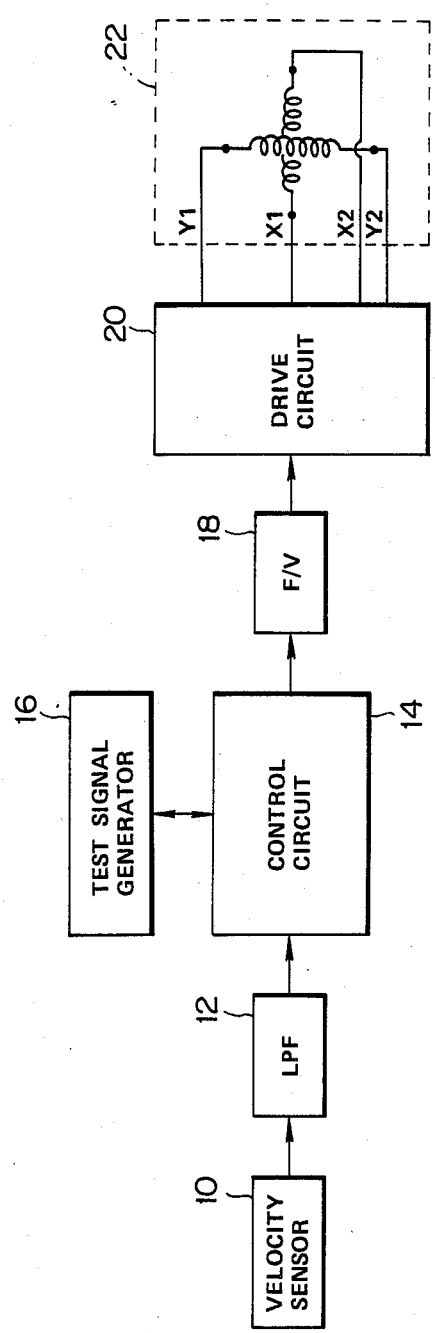
FIG. 1 is a schematic block diagram showing one embodiment of a cross-coil instrument testing apparatus made in accordance with the invention.

With reference to the drawings, where like numerals refer to like parts in the several views, there is a schematic illustration of a cross-coil instrument testing circuit embodying the invention. The numeral 10 designates a vehicle velocity sensor which may be associated with a vehicle transmission output shaft for providing a signal at a frequency corresponding to the velocity of travel of the vehicle. The vehicle velocity signal is fed from the velocity sensor 10 to a low pass filter 12 for filtering out noise which may be superimposed on the vehicle velocity signal. The filtered signal is fed from the low pass filter 12 to a control circuit 14.

The control circuit 14 makes a determination as to whether or not the velocity sensor 10 is operating without any disconnection fault. If the vehicle sensor 10 is operating with no disconnection fault, the control circuit 14 passes the filtered signal from the low pass filter 12 to a frequency-to-voltage circuit 18. If a disconnection fault occurs in the velocity sensor 10 or the associated line, the control circuit 14 provides a command causing a test signal generator 16 to generate a test signal having a predetermined frequency to the control circuit 14 where it is combined to the signal from the low pass filter 12. The combined signal is fed to the frequency-to-voltage converter 18 which converts it into a corresponding analog voltage signal. The analog voltage signal is applied to a drive circuit 20 which converts it to a corresponding drive signal. The drive signal is applied to the mutually perpendicular coils 22 to create a magnetic field, causing movement of a pointer secured on a movable magnet to provide an indication of the vehicle velocity corresponding to the analog voltage signal fed from the frequency-to-voltage converter 18.

Figure 2:
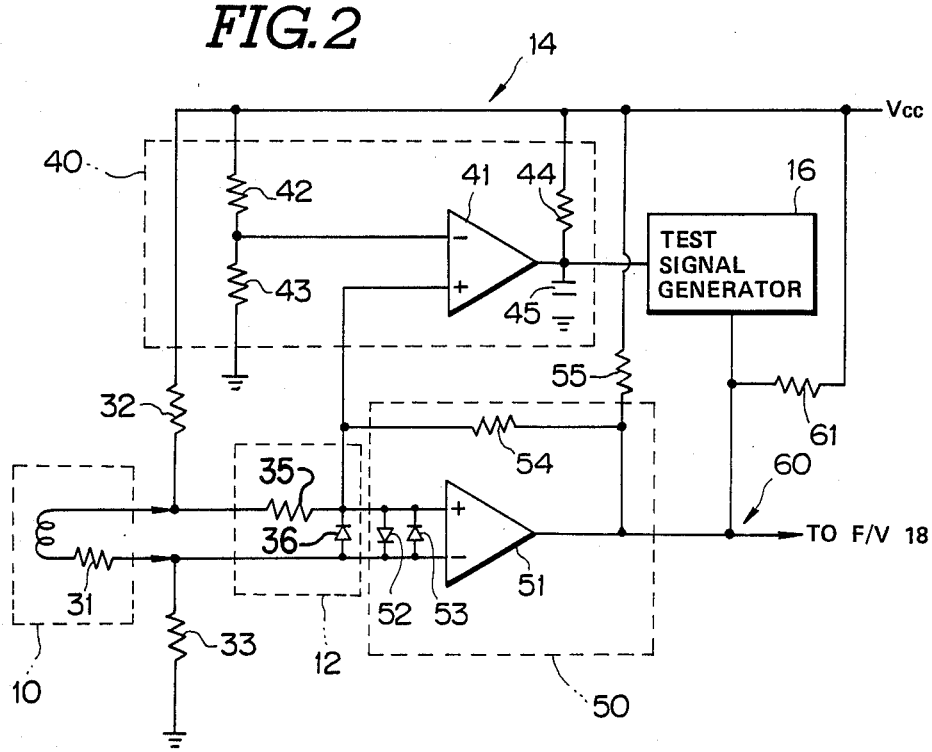
FIG. 2 is a circuit diagram showing the details of the apparatus of FIG. 1.

The details of the cross-coil instrument testing circuit is illustrated in further detail in FIG. 2. The vehicle velocity sensor 10 is shown in schematic form as having an internal resistance 31. The velocity sensor 10 is connected at one terminal to a source of DC voltage Vcc through a resistor 32 and at the other terminal to electrical ground through a resistor 33. The velocity sensor 10 produces, at the one terminal, a velocity signal (a) having a frequency which is as a function of vehicle velocity. The vehicle velocity indicative signal (a) is applied to the low pass filter 12 of the illustrated type including a resistor 35 and a capacitor 36 for filtering out noise which may be superimposed on the vehicle speed indicative signal (a).

The output of the low pass filter 12 is coupled to a fault detector circuit 40 and also to a waveform shaper circuit 50. The fault detector circuit 40 includes a comparator 41 having a positive input coupled to the low pass filter 12 and a negative input connected to a voltage divider. The voltage divider o includes a pair of resistors 42 and 43 connected in series between the source of DC voltage Vcc and electrical ground. The values of these resistors is chosen such that a voltage reference signal, which is presented to the negative input of the comparator 41, corresponds to the voltage which is attained by the low pass filter 12 when a disconnection fault occurs in the vehicle velocity sensor 10 or the associated line. Thus, the comparator 41 produces a low or logic 0 level output when the vehicle velocity sensor 10 is operating o without any disconnection fault. When a disconnection fault occurs in the vehicle velocity sensor 10 or the associated line, the signal outputted from the low pass filter 12 becomes greater than the voltage reference signal, causing the comparator 41 to produce a high or logic 1 level output. The output of the comparator 41 is connected to the source of DC voltage Vcc through a resistor 44 and also to electrical ground through a capacitor 45. The capacitor 45, which is charged with the high or logic 1 level signal fed from the comparator 41, forms a delay circuit effective to provide a predetermined delay T with respect to the output of the comparator 41. The output of the delay circuit is coupled to execute a test signal generator circuit 16 which produces a testing pulse signal at a predetermined frequency to a wired OR circuit 60. The wired OR circuit 60 is connected through a resistor 61 to the source of DC voltage Vcc.

The waveform shaper circuit 50 includes an operational amplifier 51 having a positive and negative input. A diode 52 is connected between the positive and negative inputs of the operational amplifier 51. Another diode 53 is connected across the positive and negative inputs o the operational amplifier 51 in a polarity opposite to that of the diode 52. A feedback resistor 54 is connected between the output of the operational amplifier 51 and the positive input of the operational amplifier 51. The output of the operational amplifier 51 is connected through a resistor 55 to the source of DC voltage Vcc. The output of the waveform shaper 50 is coupled to the wired OR circuit 60 which in turn is connected to the frequency-to-voltage converter circuit 18 of FIG. 1.

Figure 3:
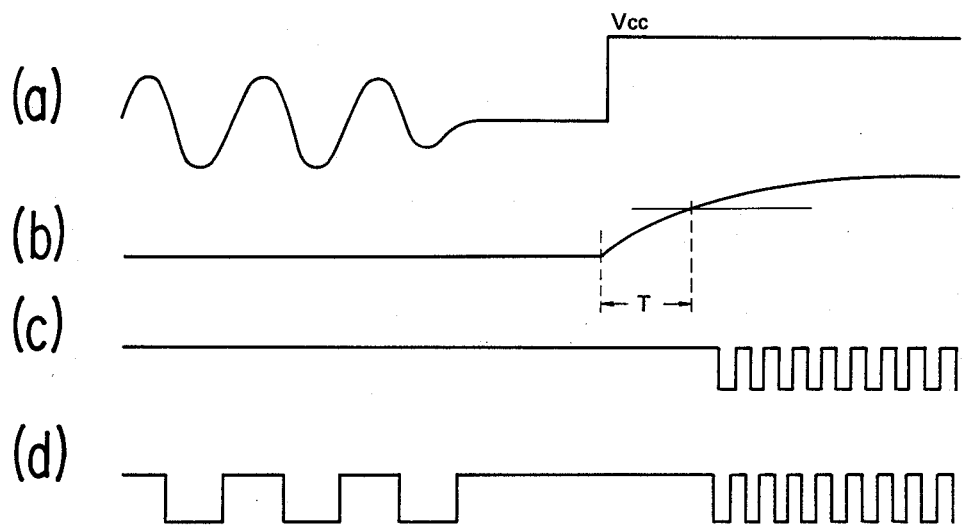
FIG. 3 contains four waveforms (a)–(d) obtained at various points in the circuit diagram of FIG. 2.

The operation of the cross-coil instrument testing circuit will be described with reference to FIG. 3. Waveform (a) of FIG. 3 illustrates an alternating signal waveform that appears at the output of the vehicle velocity sensor 10. The vehicle velocity sensor 10 generates a vehicle velocity signal having a frequency corresponding to the existing vehicle velocity when it is operating in order. Under this condition, the signal applied to the positive input of the comparator 41 is less than the voltage reference signal presented at the negative input of the comparator 41. Therefore, the comparator 41 produces a low or logic 0 level signal to the delay circuit 45. Waveform (b) of FIG. 3 illustrates a signal waveform that appears at the output of the fault detector circuit 40. As a result, the test signal generator circuit 16 remains out of operation, s indicated by the waveform (c) of FIG. 3. The vehicle velocity signal is also applied through the low pass filter 12 to the waveform shaper circuit 50 which converts it into a rectangular pulse signal having a frequency corresponding to the existing vehicle velocity, as indicated by the waveform (d) of FIG. 3. The rectangular pulse signal is fed through the frequency-to-voltage converter 18 (FIG. 1) to the drive circuit 20, causing a pointer deflection so as to provide an indication of the existing vehicle velocity.

When a disconnection fault occurs in the vehicle velocity sensor 10 or the associated line, the signal at the output of the vehicle velocity sensor 10 changes to a high voltage equal to the voltage Vcc, as indicated by the waveform (a) of FIG. 3. This causes a change of the output of the comparator 41 from the low level to a high level. The capacitor 45 delays this change a predetermined time T (second), as indicated by the waveform (b) of FIG. 3. The time delay T is effective to distinguish an actual disconnection fault from a pseudo disconnection fault which may occur for any of reasons. When the output of the fault detector circuit 40 increases to a predetermined level, the test signal generator circuit 16 starts generating a test pulse signal having a predetermined frequency, as indicated by the waveform (c) of FIG. 3, to the wired OR circuit 60. Waveform (d) of FIG. 3 illustrates a waveform that appears at the output of the wired OR circuit 60. This pulse signal is fed through the frequency-to-voltage converter 18 to the drive circuit 20 (FIG. 1), causing a movement of the pointer to a predetermined position so as to provide a disconnection fault indication. It is to be noted that a similar result can be obtained when a connector is pulled out to break a connection on the way from the vehicle velocity sensor 10 to the control circuit 14. This operation may be effected at a desired time in order to check the cross-coil instrument operation accuracy from the difference between the actual pointer position and the predetermined pointer position. Therefore, the cross-coil instrument operation accuracy can be checked merely by pulling out such a connector which is normally placed in the engine room without removal of the maintenance panel required in the prior art method.

Figure 4:
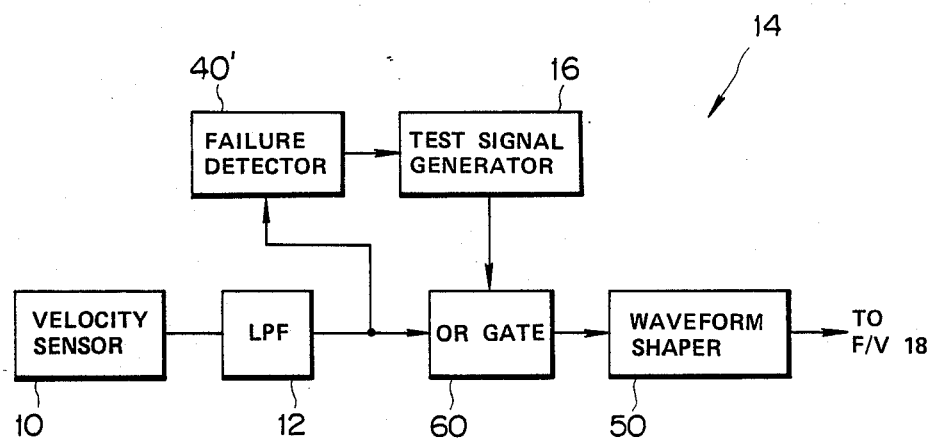
FIG. 4 is a schematic block diagram showing a modified form of the apparatus of FIG. 1.

Referring to FIG. 4, there is illustrated a modified form of the cross-coil instrument testing circuit. In this modification, the control circuit 14 includes a fault detector circuit 40' which receives an input from the low pass filter 12. The fault detector circuit 40' includes a comparator and a delay circuit. The comparator is similar to the comparator 41 of FIG. 2 and it produces a high or logic 1 level signal when the signal inputted to the fault detector signal is greater than a reference signal. The output of the comparator is coupled to the delay circuit which provides a predetermined time delay T with respect to the high or logic 1 level signal outputted from the comparator. The output of the delay circuit is coupled to a test signal generator circuit 16. The test signal generator circuit 16 generates a pulse signal having a predetermined frequency to an OR circuit 60 only when it receives a high or logic 1 level signal from the fault detector circuit 40'. The OR circuit has another input coupled to the low pass filter 12. The output of the OR circuit 60 is coupled to a waveform shaper circuit 50 which in turn is connected to the frequency-to-voltage converter 18 (FIG. 1).

Figure 5:
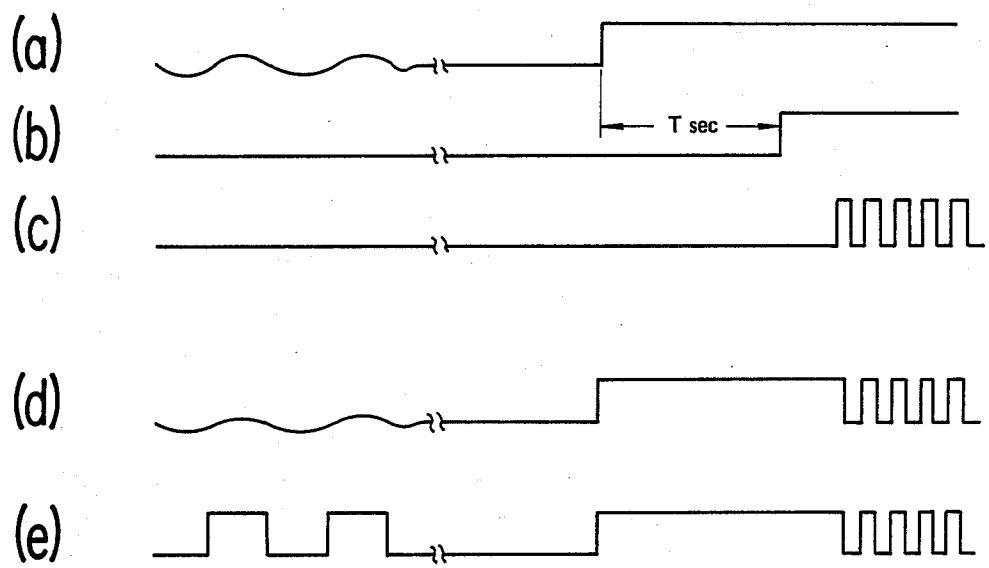
FIG. 5 contains five waveforms (a)–(e) obtained at various points in the block diagram of FIG. 4.

The operation of this modification will be described with reference to FIG. 5. Waveform (a) of FIG. 5 illustrates an alternating signal waveform that appears at the output of the vehicle velocity sensor 10. The vehicle velocity sensor 10 generates a vehicle velocity signal having a frequency corresponding to the existing vehicle velocity when it is operating in order. Under this condition, the signal applied to the fault detector circuit 40 is less than the reference signal. Therefore, the fault detector circuit 40' produces a low or logic 0 level signal, as indicated by the waveform (b) of FIG. 5, to the test signal generator circuit 16. As a result, the test signal generator circuit 16 remains out of operation, as indicated by the waveform (c) of FIG. 5. The vehicle velocity signal is also applied through the low pass filter 12 to the OR circuit 60. Waveform (d) of FIG. 6 illustrates a waveform that appears at the output of the OR circuit 60. The output signal is fed to the waveform shaper circuit 50 which converts it into a rectangular pulse signal having a frequency corresponding to that of the input signal, as indicated by the waveform (e) of FIG. 5. The rectangular pulse signal is fed through the frequency-to-voltage converter 18 (FIG. 1) to the drive circuit 20, causing a pointer deflection so as to provide an indication of the existing vehicle velocity.

When a disconnection fault occurs in the vehicle velocity sensor 10 or the associated line, the signal at the output of the vehicle velocity sensor 10 changes to a high voltage, as indicated by the waveform (a) of FIG. 5. This causes a change of the output of the fault detector circuit 40' to a high or logic 1 level a predetermined time after the disconnection fault $ occurs, as indicated by the waveform (b) of FIG. 5, by the aid of the delay circuit included in the fault detector circuit 40'. This time delay T is effective to distinguish an actual disconnection fault from a pseudo disconnection fault which may occur for any of reasons. When the output of the fault detector circuit 40' changes to a high or logic 1 level, the test signal generator circuit 16 starts generating a test pulse signal having a predetermined frequency, as indicated by the waveform (c) of FIG. 5, to the OR circuit 60. This pulse signal is fed through the waveform shaper circuit 50 to the frequency-to-voltage circuit 18 (FIG. 1) which converts it into a corresponding analog voltage signal. The analog voltage signal is fed to the drive circuit (FIG. 1), causing a movement of the pointer to a predetermined position so as to provide a disconnection fault indication. It is to be noted that a similar result can be obtained when a connector is pulled out to break a connection on the way from the vehicle velocity sensor 10 to the control circuit 14. This operation may be effected at a desired time in order to check the cross-coil instrument operation accuracy from the difference between the actual pointer position and the predetermined pointer position. Therefore, the cross-coil instrument operation accuracy can be checked merely by pulling out such a connector which is normal placed in the engine room without removal of the maintenance panel required in the prior art method.

While this invention has been described in connection with a vehicle speedometer, there is no intention to be limited to such a device and the invention is equally applicable to other cross-coil instruments. In addition, while this invention has been described in conjunction with a specific embodiment thereof, it is evident that many alternatives, modifications and variations will be apparent to those skilled in the art. Accordingly, it is intended to embrace all alternatives, modifications and variations that fall within the scope of the appended claims.

What is claimed is:

1. An apparatus for testing a cross-coil vehicular instrument having a pointer, a deflection of which is responsive to a vehicular condition signal and a sensor for sensing a vehicular condition signal and a sensor for sensing a vehicular condition to generate an output signal of a frequency indicative of the sensed vehicular condition, said apparatus comprising:

frequency-to-analog converter means for generating said vehicular condition signal to said cross-coil vehicular instrument in response to a frequency of an applied input signal, said frequency-to-analog converter means having an input receiving said sensor output signal;

a test signal generator responsive to a command signal for generating a test signal of a predetermined frequency to be applied to said input of said frequency-to-analog converter means; and control means coupled to said vehicular condition sensor for detecting a disconnection fault to generate said command signal to said test signal generator whereby said test signal is applied to the input of said frequency-to-analog converter means.

2. The apparatus as claimed in claim 1, which comprises a delay circuit for delaying the command signal a predetermined time.

3. The apparatus as claimed in claim 1, wherein the control means includes a comparator for comparing a voltage of said vehicular condition sensor output signal with a reference voltage, the comparator generating the command signal when said voltage of said sensor output signal exceeds the reference voltage.

4. The apparatus as claim in claim 3, which comprises a delay circuit for delaying the command signal a predetermined time.

5. The apparatus as claimed in claim 4, which comprises a waveform shaper circuit connected between the sensor and the converter means.

6. The apparatus as claimed in claim 4, further including an OR circuit having an input connected to said vehicular condition sensor, another input connected to said test signal generator, and an output connected to said frequency-to-analog converter means.

7. The apparatus as claimed in claim 6, further including a waveform shaper circuit connected between said OR circuit and said frequency-to-analog converter means.

8. The apparatus as claimed in claim 1, wherein said vehicular instrument is a speedometer and said sensed vehicular condition is a vehicular speed.

9. An apparatus for in-line testing of a cross-coil vehicular instrument used in combination with a vehicular condition sensor which generates an output signal having a frequency responsive to a condition of a vehicle and wherein said cross-coil vehicular condition instrument is responsive to an electrical parameter of an applied vehicular condition signal, said in-line testing apparatus comprising:

failure detecting means for generating a command signal in response to detecting a fault condition of said output signal generated by said vehicular condition sensor;

test signal generator means for generating a test signal having a predetermined frequency;

combining means for combining said vehicular sensor output signal and said test signal and generating a combined output signal; and means for applying said combined output signal to said cross-coil vehicular instrument.

10. An apparatus as claimed in claim 9, wherein said means for applying said combined output signal to said cross-coil vehicular instrument includes frequency-to-voltage converter means for generating an analog voltage signal to said cross-coil vehicular instrument responsive to a frequency of said combined output signal.

11. An apparatus as claimed in claim 9, wherein said cross-coil vehicular instrument comprises a speedometer and said vehicular condition is a speed of said vehicle.

* * * * *